(12) United States Patent
Liu (10) Patent No.: US 11,380,720 B2
(45) Date of Patent: Jul. 5, 2022

(54) ARRAY SUBSTRATE AND MANUFACTURING METHOD THEREFOR, DISPLAY PANEL, AND DISPLAY DEVICE

(71) Applicant: BOE TECHNOLOGY GROUP CO., LTD., Beijing (CN)

(72) Inventor: Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 16/610,261

(22) PCT Filed: Apr. 9, 2019

(86) PCT No.: PCT/CN2019/081941
§ 371 (c)(1),
(2) Date: Nov. 1, 2019

(87) PCT Pub. No.: WO2019/196840
PCT Pub. Date: Oct. 17, 2019

(65) Prior Publication Data
US 2020/0058680 A1    Feb. 20, 2020

(30) Foreign Application Priority Data

Apr. 12, 2018   (CN) .......................... 201810327453.3

(51) Int. Cl.
*H01L 27/146*    (2006.01)
*H01L 27/12*    (2006.01)
*H01L 27/144*    (2006.01)

(52) U.S. Cl.
CPC ........ *H01L 27/127* (2013.01); *H01L 27/1288* (2013.01); *H01L 27/1443* (2013.01); *H01L 27/1446* (2013.01)

(58) Field of Classification Search
CPC .................. H01L 27/14601; H01L 27/14612
See application file for complete search history.

(56) References Cited

U.S. PATENT DOCUMENTS

2012/0205646 A1*   8/2012   Cho ................... G02F 1/13318
                                                            257/43
2015/0123119 A1    5/2015   Sekine et al.
(Continued)

FOREIGN PATENT DOCUMENTS

CN        104637962 A      5/2015
CN        107359168 A      11/2017
(Continued)

OTHER PUBLICATIONS

International Search Report of PCT/CN2019/081941 in Chinese, dated Jul. 12, 2019, with English translation.

*Primary Examiner* — Suberr L Chi
(74) *Attorney, Agent, or Firm* — Collard & Roe, P.C.

(57) ABSTRACT

Provided are an array substrate, a manufacturing method therefor, a display panel and a display device. The array substrate includes: a photosensitive member and a thin film transistor that are located on a base substrate, the photosensitive member including a photosensitive layer; the thin film transistor is located at a side of the photosensitive member that is far from the base substrate. In the described array substrate, the photosensitive member is formed first, and then the thin film transistor is formed on the photosensitive member, which prevents the element hydrogen from influencing the thin film transistor when forming the photosensitive member, while source and drain layer patterns of the thin film transistor may be formed by means of one-time pattern processing, thus simplifying the manufacturing process.

16 Claims, 5 Drawing Sheets

(56) References Cited

U.S. PATENT DOCUMENTS

| | | | |
|---|---|---|---|
| 2016/0013243 A1* | 1/2016 | O'Rourke | H01L 31/202 257/43 |
| 2019/0019813 A1 | 1/2019 | Ren et al. | |
| 2020/0058680 A1 | 2/2020 | Liu | |

FOREIGN PATENT DOCUMENTS

| | | |
|---|---|---|
| CN | 108336100 A | 7/2018 |
| CN | 207966980 U | 10/2018 |
| KR | 10-2016-0054102 A | 5/2016 |

* cited by examiner

FIG. 2B forming a photosensitive component on a base substrate, forming the photosensitive component including forming a photosensitive layer

↓ forming a TFT, the TFT being located at a side of the photosensitive component away from the base substrate

FIG. 3A forming a photosensitive component, forming the photosensitive component including forming a photosensitive layer on a base substrate

↓ forming a TFT after forming the photosensitive component

FIG. 3B forming a photosensitive component on a base substrate, the photosensitive component including a first electrode, a photosensitive layer and a second electrode which are sequentially stacked, and the first electrode being arranged close to the base substrate — S100

↓ forming a TFT and a conductive layer on the photosensitive component, the first electrode being electrically connected with a first electrode of the TFT, and the second electrode being electrically connected with the conductive layer, the first electrode of the TFT being a source electrode or a drain electrode — S200

ARRAY SUBSTRATE AND MANUFACTURING METHOD THEREFOR, DISPLAY PANEL, AND DISPLAY DEVICE

CROSS-REFERENCE TO RELATED APPLICATIONS

This application is the National Stage of PCT/CN2019/081941 filed on Apr. 9, 2019, which claims priority under 35 U.S.C. § 119 of Chinese Application No. 201810327453.3 filed on Apr. 12, 2018, the disclosure of which is incorporated by reference.

TECHNICAL FIELD

Embodiments of the present disclosure relate to an array substrate, a manufacturing method thereof, a display panel and a display device.

BACKGROUND

At present, large-size display panels are developed towards the direction of high reliability, high resolution, high color gamut, etc., and the requirements on manufacturing process of the backplane are also continuously improved.

SUMMARY

The embodiments of the present disclosure provide an array substrate, a manufacturing method thereof, a display panel and a display device to solve the problem of complex process of forming patterns of a source-drain layer in the manufacturing process of the array substrate.

At least one embodiment of the present disclosure provide an array substrate, which includes: a photosensitive component located on a base substrate and including a photosensitive layer, and a thin film transistor (TFT) located at a side of the photosensitive component away from the base substrate.

In one or more embodiments of the present disclosure, the photosensitive component further includes a first electrode and a second electrode; the first electrode, the photosensitive layer and the second electrode are stacked, and the first electrode is closer to the base substrate than the second electrode, the TFT includes an active layer, a material of the active layer includes semiconductor, the first electrode is a light shielding layer, and an orthographic projection of the first electrode on the base substrate completely covers an orthographic projection of the active layer on the base substrate.

In one or more embodiments of the present disclosure, the second electrode is located between the base substrate and the active layer.

In one or more embodiments of the present disclosure, the TFT further includes a source-drain layer, the source-drain layer includes a source electrode and a drain electrode which are electrically connected with the active layer, respectively, and an orthographic projection of the source electrode on the base substrate and an orthographic projection of the drain electrode on the base substrate fall within the orthographic projection of the first electrode on the base substrate.

In one or more embodiments of the present disclosure, the first electrode and the source-drain layer are arranged in different layers, respectively, and one of the source electrode and the drain electrode is electrically connected with the first electrode.

In one or more embodiments of the present disclosure, the one of the source electrode and the drain electrode is in contact with the first electrode.

In one or more embodiments of the present disclosure, the array substrate further includes a conductive layer, the conductive layer is electrically connected with the second electrode, and the conductive layer and the source-drain layer are arranged in the same layer.

In one or more embodiments of the present disclosure, the array substrate further includes an interlayer insulation layer, the interlayer insulation layer is located at the side of the photosensitive component away from the base substrate and is arranged between the source electrode and the drain electrode, and the conductive layer and the source-drain layer are in contact with a surface of the interlayer insulation layer away from the base substrate.

In one or more embodiments of the present disclosure, the array substrate further includes a gate insulation layer and a gate electrode which are sequentially arranged at a side of the active layer away from the base substrate, an orthographic projection of the gate insulation layer on the base substrate and an orthographic projection of the gate electrode on the base substrate fall within the orthographic projection of the active layer on the base substrate.

In one or more embodiments of the present disclosure, the array substrate further includes a buffer layer located between the photosensitive component and the TFT, the source electrode or the drain electrode is electrically connected via a first through hole running through both the buffer layer and the interlayer insulation layer, and the conductive layer is electrically connected via a second through hole running through both the buffer layer and the interlayer insulation layer.

In one or more embodiments of the present disclosure, a material of the photosensitive layer includes PIN-type semiconductor material.

At least one embodiment of the present disclosure further provides a display panel, which includes any one of the array substrates as described above.

At least one embodiment of the present disclosure further provides a display device, which includes any one of the display panels as described above.

At least one embodiment of the present disclosure further provides a manufacturing method of an array substrate, which includes: forming a photosensitive component on a base substrate, forming the photosensitive component including forming a photosensitive layer; and forming a thin film transistor (TFT), the TFT being located at a side of the photosensitive component away from the base substrate.

At least one embodiment of the present disclosure further provides a manufacturing method of an array substrate, which includes: forming a photosensitive component, forming the photosensitive component including forming a photosensitive layer on a base substrate; and forming a thin film transistor (TFT) after forming the photosensitive component.

In one or more embodiments of the present disclosure, forming the photosensitive component further includes forming a first electrode before forming the photosensitive layer and forming a second electrode after forming the photosensitive layer, forming the TFT further includes forming an active layer and forming an interlayer insulation layer; an orthographic projection of the active layer on the base substrate falls within an orthographic projection of the first electrode on the base substrate, and the method further includes: forming a buffer layer after forming the photosensitive component and before forming the active layer; forming a first through hole and a second through hole that run through both the interlayer insulation layer and the buffer layer, forming a conductive film; and patterning the conductive film to form a conductive layer, and a source electrode of the TFT and a drain electrode of the TFT; the source electrode and the drain electrode are electrically connected with the active layer, respectively, one of the source electrode and the drain electrode is electrically connected with the first electrode via the first through hole, and the conductive layer is electrically connected with the second electrode.

In one or more embodiments of the present disclosure, the first through hole and the second through hole are formed in the same patterning process, and the source electrode, the drain electrode and the conductive layer are formed in the same patterning process.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

Hereinafter, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

At present, compensation technology is mainly used to improve the display quality of the display panel, and an optical sensor is built in the display panel for compensation. For example, a photosensitive component (for example, PIN) having photocurrent sensing function is combined with a thin film transistor (TFT) taken as a switch to detect optical changes in real-time, and then the display panel is adjusted and controlled through an external circuit.

Figure 1:
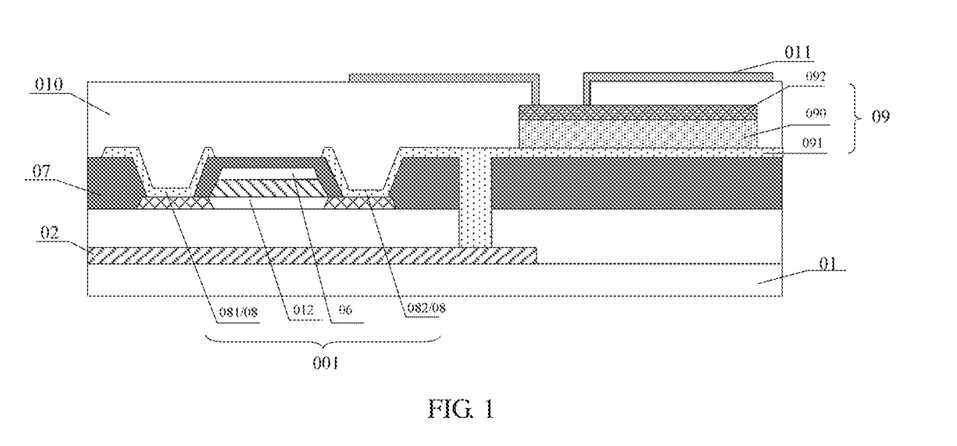
FIG. 1 is a schematic structural view of an array substrate.

FIG. 1 is a schematic structural view of an array substrate. In a top-gate array substrate, in order to avoid a channel of a TFT taken as a switch from being affected by illumination, as illustrated in FIG. 1, a light shielding layer 02 is located on a base substrate 01. For instance, the light shielding layer 02 may be formed by patterning any metallic conductive film having light shielding function. As illustrated in FIG. 1, a switching TFT 001 is located above the light shielding layer 02, and a photosensitive component 09 is located on the TFT 001. The TFT 001 includes a source-drain layer 08, a semiconductor active layer 012 and a gate electrode 06. The source-drain layer 08 includes a source electrode 081 and a drain electrode 082. The photosensitive component 09 includes a first electrode 091, a photosensitive layer 090 and a second electrode 092.

As illustrated in FIG. 1, the photosensitive layer 090 is formed on the source-drain layer 08. Because a large amount of hydrogen will be generated in the process of forming the photosensitive component 09, hydrogen has great influence on the electrical properties of the TFT. Thus, hydrogen elements should be avoided from being deposited on the TFT 001 in the manufacturing process, which requires two patterning processes to form a pattern of the source-drain layer 08, that is, the source-drain layer 08 is formed after forming patterns of a gate electrode 06 and a buffer layer 07 (interlayer dielectric, ILD), and the source-drain layer 08 must be subjected to a first patterning process. This patterning process retains metal of the source-drain layer on the gate electrode 06 of the TFT and avoids the hydrogen elements from affecting the TFT 001 in the process of forming the photosensitive layer 090. The source-drain layer 08 is subjected to a second patterning process after forming the photosensitive layer 090, and metal of the source-drain layer on the gate electrode 06 of the TFT is etched away to form a complete pattern of the source-drain layer. Subsequently, a passivation layer (PVX) 010 is formed, and a through hole is formed on the passivation layer 010. The photosensitive component 09 is connected with an external signal of the display panel through a metal layer 011 at the through hole.

The inventor(s) found that the forming of the patterns of the source-drain layer in the above process requires two patterning processes, and the manufacturing process is complex and the yield of products is affected.

Figure 2A:
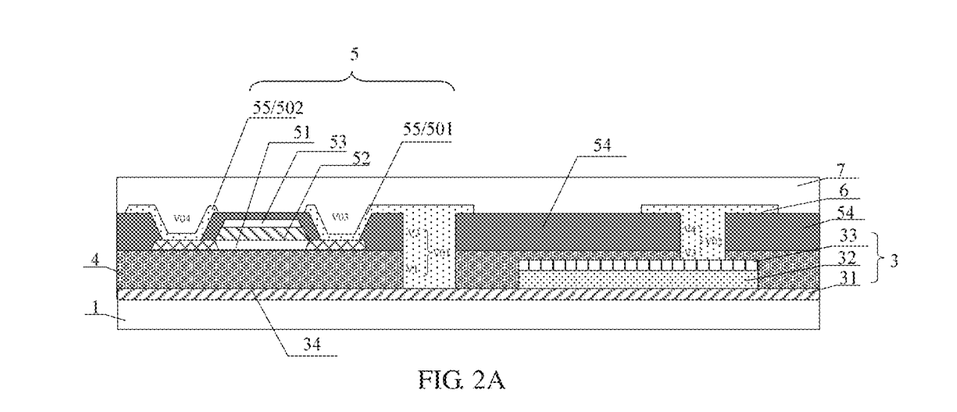
FIG. 2A is a schematic structural view of an array substrate provided by an embodiment of the present disclosure.

FIG. 2A is a schematic structural view of an array substrate provided by an embodiment of the present disclosure. As illustrated in FIG. 2A, the array substrate provided by an embodiment of the present disclosure includes: a photosensitive component 3 and a thin film transistor (TFT) 5 that are located on a base substrate 1. The photosensitive component 3 includes a photosensitive layer 32. The TFT 5 is located at a side of the photosensitive component 3 away from the base substrate 1.

In the array substrate provided by an embodiment of the present disclosure, the TFT 5 is located at a side of the photosensitive component 3 away from the base substrate 1, and the photosensitive layer 32 is formed before forming the TFT 5, thereby avoiding the influence on the TFT 5 by hydrogen elements generated in the process of forming the photosensitive layer 32. Moreover, as a layer provided with a source electrode and a drain electrode of the TFT may be formed by one patterning process, thereby simplifying the processing steps.

For instance, as illustrated in FIG. 2A, the array substrate further includes a source-drain layer 55 and a conductive layer 6. For instance, the conductive layer 6 is electrically connected with a second electrode 33, and the conductive layer 6 and the source-drain layer 55 are arranged in the same layer. The source-drain layer 55 includes a drain electrode 501 and a source electrode 502 which are electrically connected with an active layer 51, respectively. Orthographic projections of the source electrode 502 and the drain electrode 501 on the base substrate 1 fall within an orthographic projection of a first electrode 31 on the base substrate 1.

For instance, as illustrated in FIG. 2A, the first electrode 31 and the source-drain layer 55 are arranged in different layers, respectively. The first electrode 31 is electrically connected with one of the drain electrode 501 and the source electrode 502. In the embodiment of the present disclosure, the drain electrode 501 and the source electrode 502 may be interchanged. The embodiment of the present disclosure is described with reference to the case that the drain electrode 501 is electrically connected with the first electrode 31, by way of example.

For instance, as illustrated in FIG. 2A, the photosensitive component 31 includes the first electrode 31, the photosensitive layer 32 and the second electrode 33 which are stacked, and the first electrode 31 is closer to the base substrate 1 than the second electrode 33. The first electrode 31 is electrically connected with the drain electrode 501 of the TFT 5, and the second electrode 33 is electrically connected with the conductive layer 6.

For instance, as illustrated in FIG. 2A, the TFT 5 includes the active layer 51, and a material of the active layer 51 includes semiconductor; the first electrode 31 is a light shielding layer, and an orthographic projection of the first electrode 31 on the base substrate 1 completely covers an orthographic projection of the active layer 51 on the base substrate 1. The first electrode 31 also has light shielding function, so as to avoid light irradiated onto the active layer 51 from affecting the TFT 5. For instance, as illustrated in FIG. 2A, the second electrode 33 is located between the base substrate 1 and the active layer 51.

It should be understood that the first electrode 31 of the photosensitive component 3 is electrically connected with the source electrode or the drain electrode of the TFT 5; the second electrode 33 is electrically connected with the conductive layer 6 which may be electrically connected with a peripheral circuit of the array substrate; and the photosensitive component 3 having photocurrent sensing function is combined with one TFT 5 taken as a switch to detect optical changes in real-time; and the conductive layer 6 is connected with the peripheral circuit for the regulation and control of the photosensitive component 3, so the display quality can be improved by adoption of the compensation technology.

In the array substrate provided by the embodiment of the present disclosure, the photosensitive component 3 is located on the base substrate 1, and the TFT 5 and the conductive layer 6 are located on the photosensitive component 3. The photosensitive component 3 includes the first electrode 31, the photosensitive layer 32 and the second electrode 33 which are stacked; the first electrode 31 is arranged close to the base substrate 1; the first electrode 31 of the photosensitive component 3 is electrically connected with one of the drain electrode 501 or the source electrode 502 of the TFT 5; and the second electrode 33 of the photosensitive component 3 is electrically connected with the conductive layer 6. In the manufacturing process, the photosensitive component 3 is formed at first and then the TFT 5 is formed on the photosensitive component 3, thereby avoiding the influence on the TFT 5 by hydrogen elements generated in the process of forming the photosensitive component 3. As the patterns of the source-drain layer 55 may be formed by one patterning process, the manufacturing process is simplified.

As illustrated in FIG. 2A, the TFT 5 further includes a gate insulation layer 52 and a gate electrode 53 which are sequentially arranged at a side of the active layer 51 away from the base substrate 1, and orthographic projections of the gate insulation layer 52 and the gate electrode 53 on the base substrate 1 fall within the orthographic projection of the active layer 51 on the base substrate 1. For instance, a material of the gate electrode 53 includes a metal, and a material of the gate insulation layer 52 includes an insulation material.

For instance, as illustrated in FIG. 2A, the above is described with reference to the case that the TFT 5 is a top-gate TFT, by way of example, however, it should be understood that the structure of the embodiment of the present disclosure is also applicable in a TFT of a bottom-gate structure. That is to say, in the array substrate provided by another embodiment of the present disclosure, the top-gate TFT in FIG. 2A is replaced with a bottom-gate TFT.

The first electrode 31 may be extended to a position below the active layer 51 and taken as a light shielding layer 34, that is, the light shielding layer 34 and the first electrode 31 are integrally formed. As illustrated in FIG. 2A, an orthographic projection of the first electrode 31 on the base substrate 1 or an orthographic projection of the light shielding layer 34 on the base substrate 1 covers the orthographic projection of the active layer 51 of the TFT 5 on the base substrate 1, so as to prevent a channel of the TFT 5 from being affected by illumination below the base substrate 1 and then avoid the deterioration of the electrical properties of the TFT.

As illustrated in FIG. 2A, the light shielding layer 34 is located right under the active layer 51, and the light shielding layer 34 and the first electrode 31 are integrally formed. The first electrode 31 simultaneously has the functions of light shielding and being taken as one electrode of the photosensitive component, namely the light shielding layer 34 may be taken as one electrode of the photosensitive component 3. In the manufacturing process, the processing steps are simplified; the electrode layer having light shielding function may be formed on the base substrate; and the light shielding layer 34 and the first electrode 31 that are of an integral structure are formed by one patterning process.

The photosensitive layer 32 is formed on the first electrode 31, and a material of the photosensitive layer 32 may adopt a photosensitive material which may be PIN semiconductor material with a thickness of about 1 μm. For instance, the photosensitive layer 32 may be formed by a conventional method. The second electrode 33 is formed on the photosensitive layer 32, and a material of the second electrode 33 may be transparent conductive layer material such as indium tin oxide (ITO).

A forming process of the first electrode 31, the photosensitive layer 32 and the second electrode 33 of the photosensitive component 3 may include the following steps: (1) forming a first electrode layer having light shielding function on a base substrate; (2) forming a PIN film layer with a thickness of about 1 μm on the first electrode layer by chemical vapor deposition (CVD) process; and (3) forming a transparent conductive second electrode layer on the PIN film layer, and subsequently forming a pattern of the photosensitive component 3 by a wet etching process and a subsequent dry etching process.

After the photosensitive component 3 is formed, the TFT 5 is formed on the photosensitive component. The manufacturing process of the TFT 5 may refer to a conventional process, without repeated herein.

For instance, the conductive layer 6 and the drain electrode 501 of the TFT 5 are arranged in the same layer, that is, the conductive layer 6 and the source-drain layer 55 of the TFT 5 are arranged in the same layer. A material of the conductive layer 6 may be the same as a material of the source-drain layer 55, and the material of the conductive layer 6 and the source-drain layer 55, for instance, includes a metal or an alloy material. The structure can simplify the manufacturing process, and a pattern of the source-drain layer 55 and a pattern of the conductive layer 6 may be simultaneously formed by one patterning process. The conductive layer 6 is configured to be connected with a peripheral circuit of the array substrate for the regulation and control of the photosensitive component 3.

It should be understood that in the array substrate as illustrated in FIG. 1, because the photosensitive component is located at a side of the TFT away from the base substrate, the hydrogen elements generated in the process of forming the photosensitive layer of the photosensitive component will affect the electrical properties of the TFT. Thus, a source-drain film layer is not completely patterned before forming the photosensitive component, and a part of the source-drain film layer above the active layer of the TFT is retained; and after the photosensitive layer of the photosensitive component is formed, the source-drain film layer is subjected to a second patterning process to form a complete pattern of the source-drain layer. In the application, in the array substrate as illustrated in FIG. 2A, because the photosensitive component 3 is formed before forming the TFT 5, in the subsequent process of forming the TFT 5, only one patterning process is required to form the pattern of the source-drain layer without considering the influence of the hydrogen elements on the TFT. Therefore, the manufacturing process of the application is simpler, and the forming steps of the TFT are simplified.

For instance, as illustrated in FIG. 2A, a buffer layer 4 and an interlayer insulation layer 54 which are stacked are formed between the first electrode 31 and the drain electrode 501 of the TFT 5, namely between the first electrode 31 and the source-drain layer 55; the buffer layer 4 is closer to the base substrate 1 than the interlayer insulation layer 54; and the buffer layer 4 and the interlayer insulation layer 54 completely cover the photosensitive component 3.

A through hole V1 is formed in the buffer layer 4; a through hole V2 is formed in the interlayer insulation layer 54; the through hole V1 and the through hole V2 form a first through hole V01; and the drain electrode 501 of the TFT 5 is electrically connected with the first electrode 31 via the first through hole V01. Thus, an electrical connection between the drain electrode 501 of the TFT 5 and the light shielding layer 34 can be also realized, and then the electrical properties of the TFT can be improved. It should be understood that the through hole V1 and the through hole V2 may be formed by an exposure process and an etching process before forming the source-drain layer 55. In the process of forming the source-drain film layer, the drain electrode 501 of the TFT 5 is electrically connected with the first electrode 31 through a metallic material of a part of the source-drain film layer. For instance, the through hole V1 and the through hole V2 may be formed in the same patterning process.

Similarly, a through hole V3 is also formed in the buffer layer 4; a through hole V4 is also formed in the interlayer insulation layer 54; the through hole V3 and the through hole V4 form a second through hole V02; and the conductive layer 6 is electrically connected with the second electrode 33 via the second through hole V02. For instance, the through hole V3 and the through hole V4 may be formed in the same patterning process. In order to further simplify the process, the through hole V1, the through hole V2, the through hole V3 and the through hole V4 may be formed in the same patterning process. For instance, the first through hole V01 runs through both the buffer layer 4 and the interlayer insulation layer 54; the second through hole V02 runs through both the buffer layer 4 and the interlayer insulation layer 54; and the first through hole V01 and the second through hole V02 may be formed in the same patterning process.

For instance, as illustrated in FIG. 2A, the interlayer insulation layer 54 is located at a side of the photosensitive component 3 away from the base substrate 1 and is arranged between the source electrode 502 and the drain electrode 501; and the conductive layer 6 and the source-drain layer 55 are in contact with a surface of the interlayer insulation layer 54 away from the base substrate 1.

For instance, as illustrated in FIG. 2A, the source electrode 502 or the drain electrode 501 is electrically connected with the first electrode via the first through hole V01 running through the buffer layer 4 and the interlayer insulation layer 54, and the conductive layer 6 is electrically connected with the second electrode via the second through hole V02 running through the buffer layer 4 and the interlayer insulation layer 54.

For instance, as illustrated in FIG. 2A, the array substrate further includes a passivation layer 7 which has the function of protecting the source electrode 502, the drain electrode 501 and the conductive layer 6. The passivation layer 7 may be made from an insulation material.

In the array substrate provided by the embodiment of the present disclosure, an electrical connection between the TFT 5 and the photosensitive component 3 and an electrical connection between the photosensitive component 3 and the peripheral circuit of the array substrate can be realized through a through hole located in the buffer layer 4 and the interlayer insulation layer 54 and partial conductive source-drain film layer located in the through hole. Four through holes may be formed only by one exposure process and one etching process, and the electrical connection can be realized. In the array substrate as illustrated in FIG. 1, the source electrode or the source electrode of the source-drain layer is simultaneously taken as one electrode of the photosensitive component, and the other electrode of the photosensitive component must be connected with the peripheral circuit via both the through hole located thereon and a conductive metal. Moreover, an electrical connection between the light shielding layer and the source-drain layer must be realized via other through holes. The two types of through holes must be formed in two exposure processes and two etching processes. Obviously, compared with the manufacturing process of the array substrate as illustrated in FIG. 1, the manufacturing process of the array substrate as illustrated in FIG. 2A is simpler and more convenient in overall design.

The above is described with reference to the case that the TFT 5 is a top-gate structure, by way of example. It should be understood that the above similar structure may also be adopted in a bottom-gate structure, that is, the TFT 5 and the conductive layer 6 are formed after the photosensitive component 3 is formed; any one of the source electrode and the drain electrode of the TFT 5 is electrically connected with the first electrode 31 of the photosensitive component 3; and the conductive layer 6 is electrically connected with the second electrode 33 of the photosensitive component 3. The patterning process of the patterns of the source-drain layer of the TFT of the array substrate can be also simplified.

The specific structure is similar to that of the above embodiment, without repeated herein.

Figure 2B:
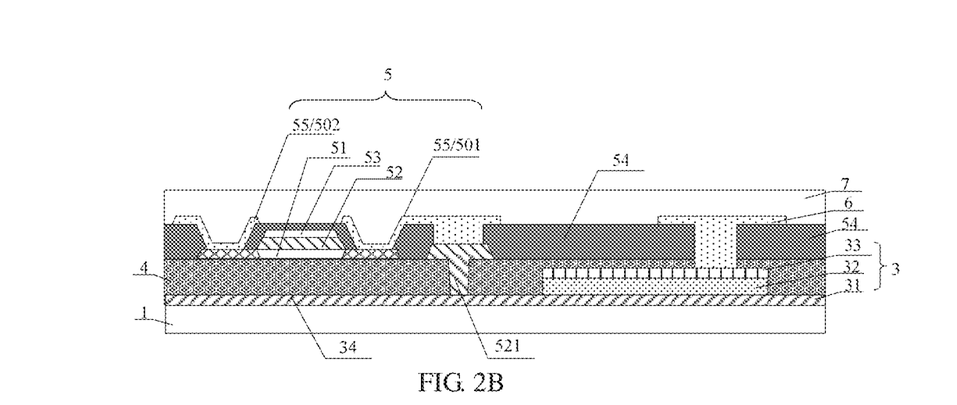
FIG. 2B is a schematic structural view of an array substrate provided by another embodiment of the present disclosure.

FIG. 2B is a schematic structural view of an array substrate provided by another embodiment of the present disclosure. Compared with the structure as illustrated in FIG. 2A, the drain electrode 501 is connected with the first electrode 31 through a connection electrode 521.

Figure 3A:
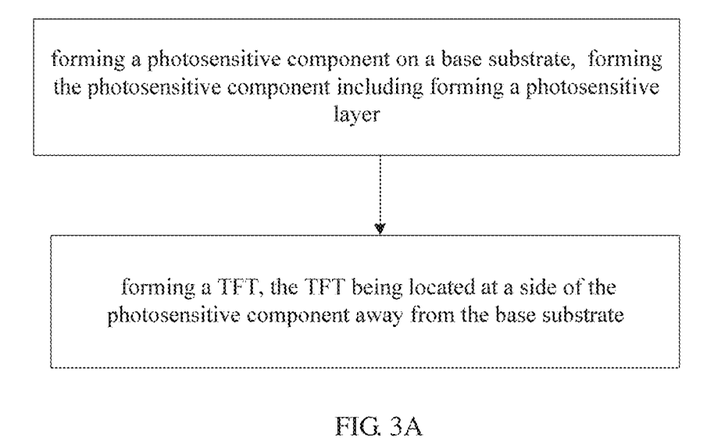
FIG. 3A is a flowchart of a manufacturing method of an array substrate provided by an embodiment of the present disclosure.

FIG. 3A is a flowchart of a manufacturing method of an array substrate provided by an embodiment of the present disclosure. At least one embodiment of the present disclosure further provides a manufacturing method of an array substrate, which includes: forming a photosensitive component on a base substrate; and forming a TFT that is located at a side of the photosensitive component away from the base substrate. Forming the photosensitive component includes forming a photosensitive layer.

Figure 3B:
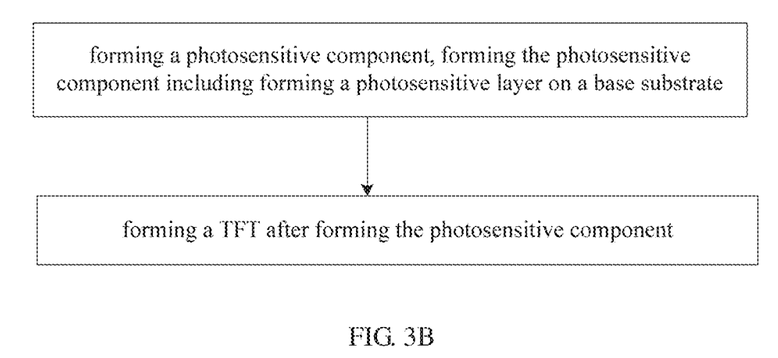
FIG. 3B is a flowchart of a manufacturing method of an array substrate provided by an embodiment of the present disclosure.

FIG. 3B is a flowchart of a manufacturing method of an array substrate provided by an embodiment of the present disclosure. At least one embodiment of the present disclosure further provides a manufacturing method of an array substrate, which includes: forming a photosensitive component; and forming a TFT after forming the photosensitive component. Forming the photosensitive component includes forming a photosensitive layer on a base substrate.

For instance, forming the photosensitive component further includes forming a first electrode before forming the photosensitive layer and forming a second electrode after forming the photosensitive layer, forming the TFT further includes forming an active layer and forming an interlayer insulation layer; an orthographic projection of the active layer on the base substrate falls within an orthographic projection of the first electrode on the base substrate; and the method further includes: forming a buffer layer after forming the photosensitive component and before forming the active layer; forming a first through hole and a second through hole running through both the interlayer insulation layer and the buffer layer; forming a conductive film; and patterning the conductive film to form a conductive layer and a source electrode of the TFT and a drain electrode of the TFT. The source electrode and the drain electrode are electrically connected with the active layer, respectively. One of the source electrode and the drain electrode is electrically connected with the first electrode via the first through hole; and the conductive layer is electrically connected with the second electrode.

For instance, the first through hole and the second through hole are formed in the same patterning process, and the source electrode, the drain electrode and the conductive layer are formed in the same patterning process.

Figure 3C:
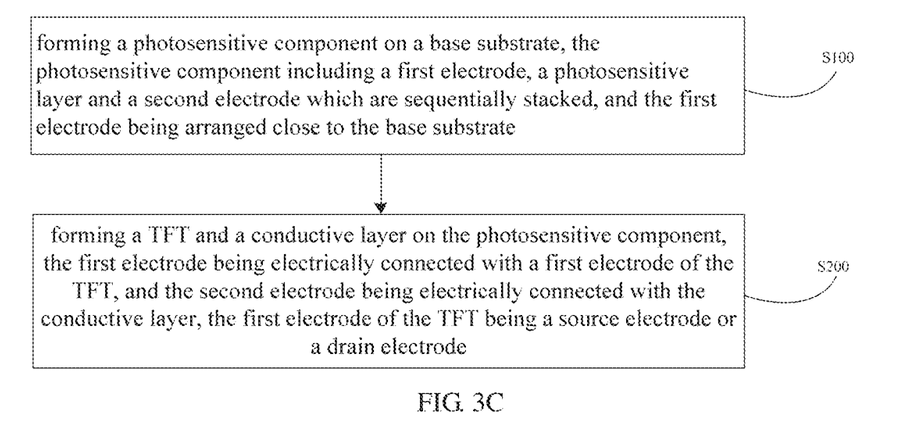
FIG. 3C is a flowchart of a manufacturing method of an array substrate provided by an embodiment of the present disclosure.

FIG. 3C is a flowchart of a manufacturing method of an array substrate provided by an embodiment of the present disclosure. As illustrated in FIG. 3C, the manufacturing method of the array substrate includes the following steps.

S100: forming a photosensitive component on a base substrate, the photosensitive component including a first electrode, a photosensitive layer and a second electrode which are sequentially stacked, and the first electrode being closer to the base substrate than the second electrode.

The first electrode may be extended to a position below the TFT and taken as a light shielding layer of the active layer of the TFT. For instance, the forming process of the first electrode 31 may also include forming a first electrode film layer, and patterning the first electrode film layer to form the first electrode 31.

For instance, a forming process of the photosensitive component includes: forming the first electrode 31 having a light shielding function on the base substrate 1 at first, forming a PIN film layer with a thickness of about 1 μm on the first electrode 31 having the light shielding function by CVD process, forming a transparent conductive second electrode layer on the PIN film layer by a sputtering process, and subsequently forming patterns of the photosensitive layer 32 and the second electrode 33 by a wet etching process and a subsequent dry etching process.

S200: forming a TFT 5 and a conductive layer 6 on the photosensitive component, the first electrode 31 being electrically connected with one of a drain electrode 501 or a source electrode 502 of the TFT 5, and the second electrode 33 being electrically connected with the conductive layer 6.

For instance, after the step S100 is executed, the forming process of the TFT 5 and the conductive layer 6 is performed, and the conductive layer 6 may be arranged in the same layer as a source-drain layer 55 (as illustrated in FIG. 2A) of the TFT 5.

For instance, after the step S100 is executed, the method includes forming a buffer film layer by a CVD process firstly, and a material of the buffer film layer may be SiOx or SiNx. Secondly, the method includes forming an active film layer and patterning the active film layer to form a semiconductor layer. Thirdly, the method includes forming a gate insulation film layer and a gate film and performing one patterning process on the gate insulation film layer and the gate film to form a gate insulation layer 52 and a gate electrode 53; a material of the gate insulation film layer may be SiOx; and the gate film may be made from any metallic material with good conductivity. Fourthly, the method includes converting a part of the active layer 51 not covered by either the gate electrode 53 or the gate insulation layer 52 into conductor. Fifthly, the method includes forming an interlayer insulation film, and a material of the interlayer insulation film may be SiOx. Sixthly, the method includes patterning the interlayer insulation film to form a first through hole V01, a second through hole V02, a third through hole V03 and a fourth through hole V04; the first through hole V01 and the second through hole V02 run through the gate insulation film and the interlayer insulation film; and the third through hole V03 and the fourth through hole V4 run through the interlayer insulation film. Seventhly, after the through holes are formed, the method includes forming a conductive material layer and patterning the conductive material layer to form the source-drain layer 55 and the conductive layer 6, so as to complete an electrical connection between the source electrode 502 and the active layer 51, an electrical connection between the drain electrode 501 and the active layer 51, an electrical connection between the first electrode 31 and the drain electrode 501 of the TFT 5, and an electrical connection between the second electrode 33 and the conductive layer 6. Finally, after the above steps are executed, a passivation layer 7 may be formed subsequently to protect the TFT 5. After this step is executed, the structure as illustrated in FIG. 2A may be formed.

FIG. 4A to FIG. 4K are schematic diagrams of the manufacturing method of an array substrate provided by an embodiment of the present disclosure. Description will be given below to the manufacturing method of the array substrate provided by an embodiment of the present disclosure with reference to FIG. 4A to 4K.

Figure 4A:
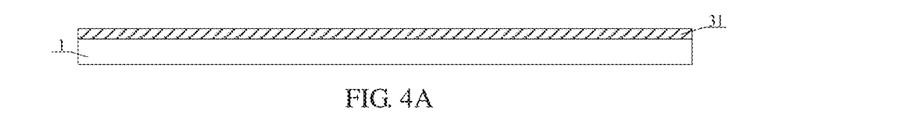
FIG. 4A to FIG. 4K are schematic diagrams of a manufacturing method of the array substrate provided by an embodiment of the present disclosure.

As illustrated in FIG. 4A, the method includes forming a first electrode 31 on a base substrate 1.

Figure 4B:
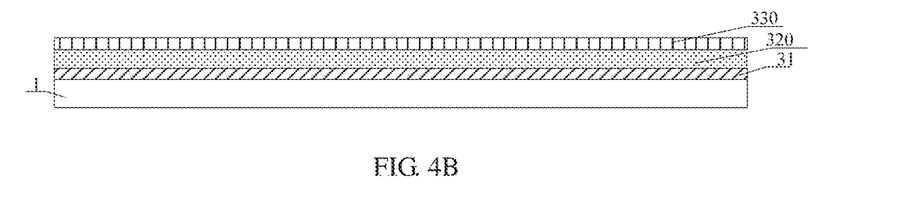

As illustrated in FIG. 4B, the method includes forming a photosensitive film 320 and a second electrode film 330 on the first electrode 31.

Figure 4C:
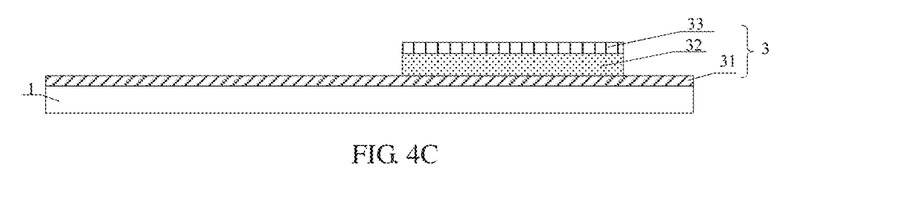

As illustrated in FIG. 4C, the method includes patterning both the photosensitive film 320 and the second electrode film 330 to form a photosensitive layer 32 and a second electrode 33.

Figure 4D:
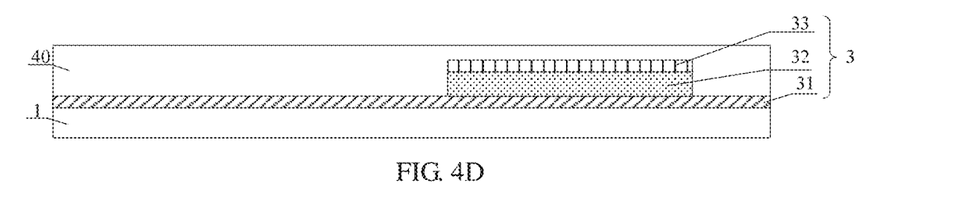

As illustrated in FIG. 4D, the method includes forming a buffer film layer 40 on the photosensitive layer 32 and the second electrode 33.

Figure 4E:
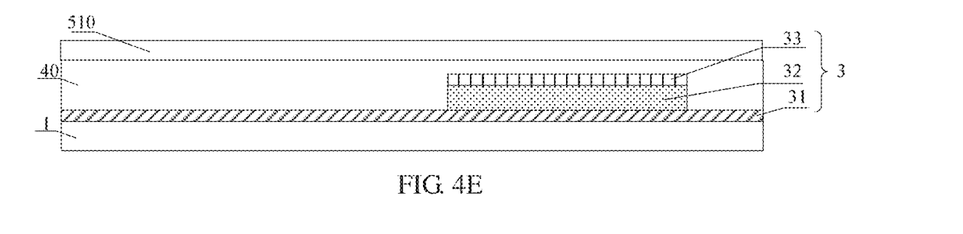

As illustrated in FIG. 4E, the method includes forming an active film layer 510 on the buffer film layer 40.

Figure 4F:
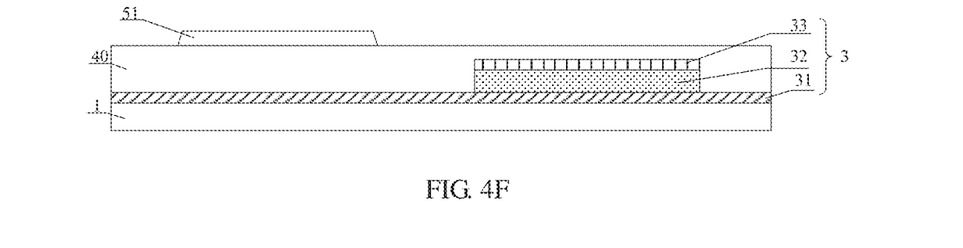

As illustrated in FIG. 4F, the method includes patterning the active film layer 510 to form an active layer 51.

Figure 4G:
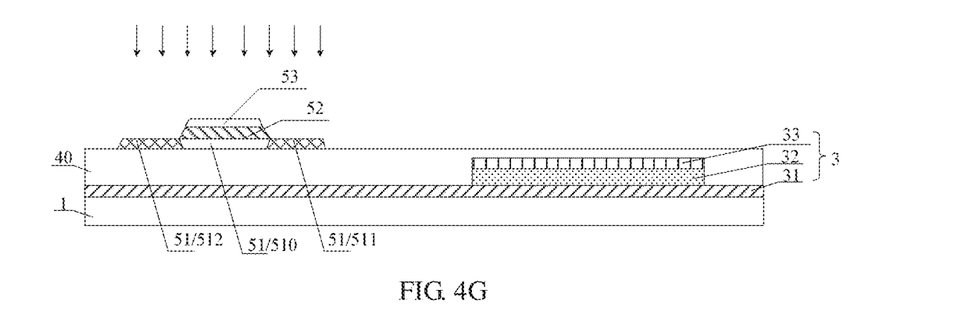

As illustrated in FIG. 4G, the method includes forming a gate insulation layer 52 and a gate electrode 53 on the active layer 51, and convening a part of the active layer 51 not covered by the gate electrode 53 and the gate insulation layer 52 by a self-alignment process.

Figure 4H:
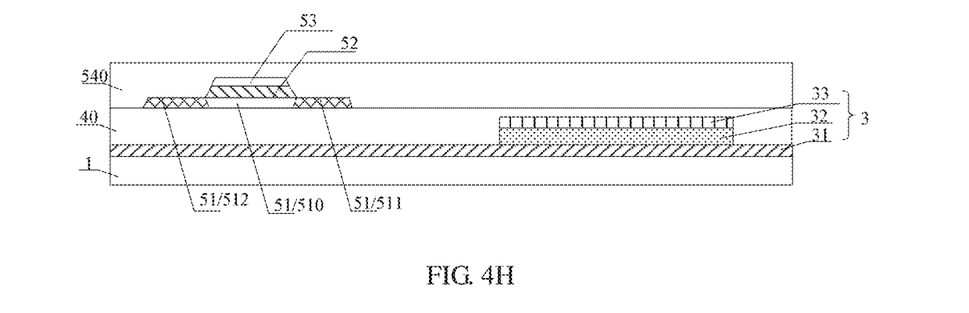

As illustrated in FIG. 4H, the method includes forming an interlayer insulation film 540 on the gate insulation layer 52 and the gate electrode 53.

Figure 4I:
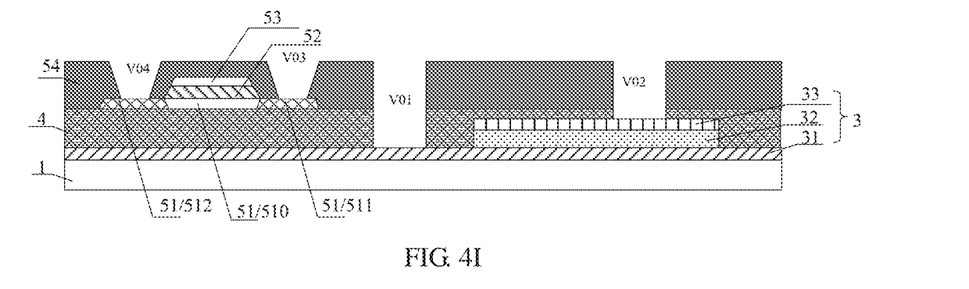

As illustrated in FIG. 4I, the method includes patterning the interlayer insulation film 540 and the buffer film layer 40 to form a first through hole V01 and a second through hole V02, and patterning the interlayer insulation film 540 to form a third through hole V03 and a fourth through hole V04.

Figure 4J:
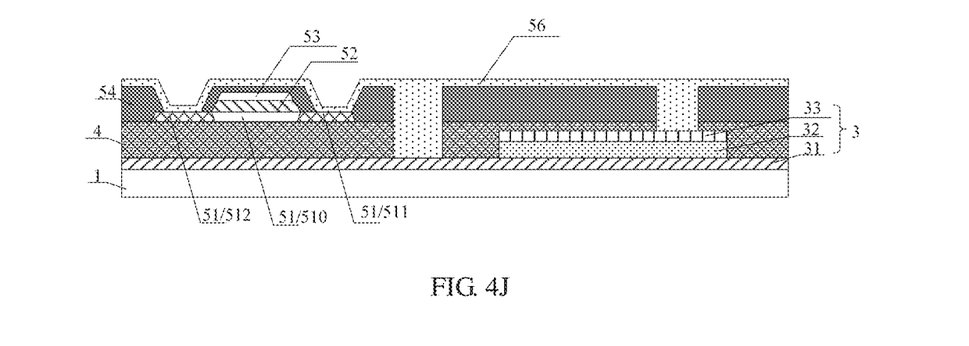

As illustrated in FIG. 4J, the method includes forming a conductive material layer 56.

Figure 4K:
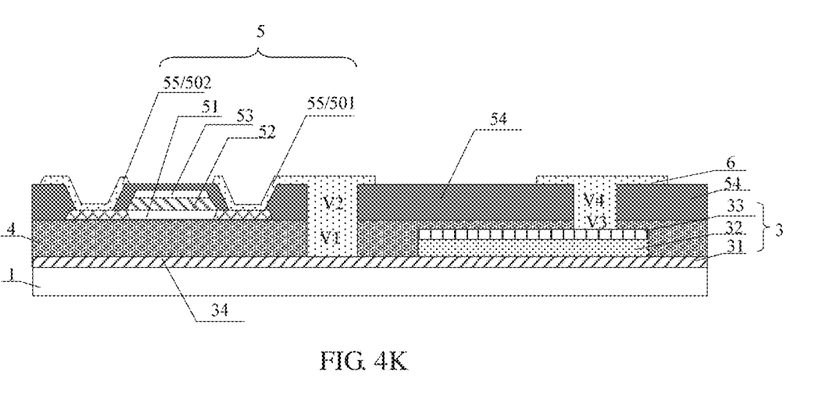

As illustrated in FIG. 4K, the method includes patterning the conductive material layer 56 to form a source electrode 502, a drain electrode 501 and a conductive layer 6.

As illustrated in FIG. 4K, the drain electrode 501 and the source electrode 502 are electrically connected with the active layer 51 via the third through hole V03 and the fourth through hole V04, respectively; the conductive layer 6 is electrically connected with the second electrode 33 via the second through hole V02; and the drain electrode 501 is electrically connected with the first electrode 31 via the first through hole V01.

The method includes forming a passivation layer 7 on the structure as illustrated in FIG. 4K, and then the array substrate as illustrated in FIG. 2A can be obtained.

As illustrated in FIG. 4G, after the self-alignment process, the active layer 51 includes a channel region 510, a source region 512 and a drain region 511.

For instance, the first through hole V01, the second through hole V02, the third through hole V03 and the fourth through hole V04 are formed in the same patterning process, without limited thereto.

In the manufacturing method of the array substrate, the photosensitive component 3 is formed at first and then the TFT 5 is formed on the photosensitive component 3, thereby avoiding the influence on the TFT 5 by hydrogen elements generated in the process of forming the photosensitive component 3. As the patterns of the source-drain layer of the TFT 5 may be formed by one patterning process, the manufacturing process is simplified.

The embodiment of the present disclosure further provides a display panel, which includes the array substrate provided by the foregoing embodiment.

The embodiment of the present disclosure further provides a display device, which includes the display panel provided by any foregoing embodiment.

For instance, the display device may be any product or component with display function such as a mobile phone, a watch, a tablet PC, a TV, a displayer, a notebook computer, a digital photo frame, a navigator or an e-paper.

The above are merely specific implementations of the present disclosure without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the appended claims.

What is claimed is:

1. An array substrate, comprising:
    a photosensitive component located on a base substrate and comprising a photosensitive layer; and
    a thin film transistor (TFT) located at a side of the photosensitive component away from the base substrate;
    wherein the photosensitive layer has an orthographic projection on the base substrate not falling within an orthographic projection of the TFT on the base substrate, and
    wherein the photosensitive component further comprises a first electrode and a second electrode; the first electrode, the photosensitive layer and the second electrode are stacked, and the first electrode is closer to the base substrate than the second electrode,
    the TFT comprises an active layer, a material of the active layer comprises semiconductor, and
    the first electrode is a light shielding layer, and an orthographic projection of the first electrode on the base substrate completely covers an orthographic projection of the active layer on the base substrate.

2. The array substrate according to claim 1, wherein the second electrode is located between the base substrate and the active layer.

3. The array substrate according to claim 1, wherein the TFT further comprises a source-drain layer, the source-drain layer comprises a source electrode and a drain electrode which are electrically connected with the active layer, respectively, and
    an orthographic projection of the source electrode on the base substrate and an orthographic projection of the drain electrode on the base substrate fall within the orthographic projection of the first electrode on the base substrate.

4. The array substrate according to claim 3, wherein the first electrode and the source-drain layer are arranged in different layers, respectively, and one of the source electrode and the drain electrode is electrically connected with the first electrode.

5. The array substrate according to claim 4, wherein the one of the source electrode and the drain electrode is in contact with the first electrode.

6. The array substrate according to claim 3, further comprising a conductive layer, wherein the conductive layer is electrically connected with the second electrode, and the conductive layer and the source-drain layer are arranged in the same layer.

7. The array substrate according to claim 6, further comprising an interlayer insulation layer, wherein the interlayer insulation layer is located at the side of the photosensitive component away from the base substrate and is arranged between the source electrode and the drain electrode, and the conductive layer and the source-drain layer are in contact with a surface of the interlayer insulation layer away from the base substrate.

8. The array substrate according to claim 7, further comprising a gate insulation layer and a gate electrode which are sequentially arranged at a side of the active layer away from the base substrate, wherein an orthographic projection of the gate insulation layer on the base substrate and an orthographic projection of the gate electrode on the base substrate fall within the orthographic projection of the active layer on the base substrate.

9. The array substrate according to claim 7, further comprising a buffer layer located between the photosensitive component and the TFT, wherein the source electrode or the drain electrode is electrically connected with the first electrode via a first through hole running through both the buffer layer and the interlayer insulation layer, and the conductive layer is electrically connected with the second electrode via a second through hole running through both the buffer layer and the interlayer insulation layer.

10. The array substrate according to claim 1, wherein a material of the photosensitive layer comprises PIN-type semiconductor material.

11. A display panel, comprising the array substrate according to claim 1.

12. A display device, comprising the display panel according to claim 11.

13. A manufacturing method of an array substrate, comprising:
    forming a photosensitive component on a base substrate, wherein forming the photosensitive component comprises forming a photosensitive layer; and
    forming a thin film transistor (TFT), wherein the TFT is located at a side of the photosensitive component away from the base substrate;
    wherein the photosensitive layer has an orthographic projection on the base substrate not falling within an orthographic projection of the TFT on the base substrate, and
    wherein forming the photosensitive component further comprises forming a first electrode before forming the photosensitive layer and forming a second electrode after forming the photosensitive layer,
    forming the TFT further comprises forming an active layer and forming an interlayer insulation layer, wherein an orthographic projection of the active layer on the base substrate falls within an orthographic projection of the first electrode on the base substrate; and
    the method further comprises:
    forming a buffer layer after forming the photosensitive component and before forming the active layer;
    forming a first through hole and a second through hole that run through both the interlayer insulation layer and the buffer layer;
    forming a conductive film; and
    patterning the conductive film to form a conductive layer, a source electrode of the TFT and a drain electrode of the TFT, wherein the source electrode and the drain electrode are electrically connected with the active layer, respectively, one of the source electrode and the drain electrode is electrically connected with the first electrode via the first through hole, and the conductive layer is electrically connected with the second electrode.

14. The manufacturing method according to claim 13, wherein the first through hole and the second through hole are formed in the same patterning process, and the source electrode, the drain electrode and the conductive layer are formed in the same patterning process.

15. A manufacturing method of an array substrate, comprising:
    forming a photosensitive component, wherein forming the photosensitive component comprises forming a photosensitive layer on a base substrate; and
    forming a thin film transistor (TFT) after forming the photosensitive component;
    wherein the photosensitive layer has an orthographic projection on the base substrate not falling within an orthographic projection of the TFT on the base substrate, and
    wherein forming the photosensitive component further comprises forming a first electrode before forming the photosensitive layer and forming a second electrode after forming the photosensitive layer,
    forming the TFT further comprises forming an active layer and forming an interlayer insulation layer; wherein an orthographic projection of the active layer on the base substrate falls within an orthographic projection of the first electrode on the base substrate, and
    the method further comprises:
    forming a buffer layer after forming the photosensitive component and before forming the active layer;
    forming a first through hole and a second through hole that run through both the interlayer insulation layer and the buffer layer;
    forming a conductive film; and
    patterning the conductive film to form a conductive layer, and a source electrode of the TFT and a drain electrode of the TFT, wherein the source electrode and the drain electrode are electrically connected with the active layer, respectively, one of the source electrode and the drain electrode is electrically connected with the first electrode via the first through hole, and the conductive layer is electrically connected with the second electrode.

16. The manufacturing method according to claim 15, wherein the first through hole and the second through hole are formed in the same patterning process, and the source electrode, the drain electrode and the conductive layer are formed in the same patterning process.

* * * * *